United States Patent
Nakagawa

(10) Patent No.: US 8,245,114 B2
(45) Date of Patent: Aug. 14, 2012

(54) TRANSMITTING APPARATUS, TRANSMITTING METHOD, AND PROGRAM

(75) Inventor: Toshiyuki Nakagawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 633 days.

(21) Appl. No.: 12/505,526

(22) Filed: Jul. 19, 2009

(65) Prior Publication Data

US 2010/0023837 A1 Jan. 28, 2010

(30) Foreign Application Priority Data

Jul. 24, 2008 (JP) ................. 2008-190945

(51) Int. Cl.
*H03M 13/00* (2006.01)
(52) U.S. Cl. .............. 714/776; 375/240.27; 382/309
(58) Field of Classification Search .......... 714/776; 375/240.27; 382/309
See application file for complete search history.

(56) References Cited

U.S. PATENT DOCUMENTS

| | | | |
|---|---|---|---|
| 6,192,080 B1 * | 2/2001 | Sun et al. ................. | 375/240.16 |
| 6,317,462 B1 | 11/2001 | Boyce | |
| 2003/0091054 A1 * | 5/2003 | Futenma et al. ......... | 370/395.42 |
| 2005/0123044 A1 * | 6/2005 | Katsavounidis et al. | 375/240.12 |
| 2005/0152342 A1 * | 7/2005 | Gass ............................ | 370/352 |

FOREIGN PATENT DOCUMENTS

JP 3831558 B2 10/2006

* cited by examiner

*Primary Examiner* — M. Mujtaba K Chaudry
(74) *Attorney, Agent, or Firm* — Canon U.S.A., Inc. IP Division

(57) ABSTRACT

A change amount detector calculates the amount of change between frames in a predetermined display range in an image corresponding to image data. When the calculated amount of change is larger than a first threshold, a redundancy determining portion determines the number of data of redundant data such that the number of data of the redundant data for image data in the predetermined display range is increased. A communication controller transmits data containing image data based on the determined number of data of the redundant data.

21 Claims, 5 Drawing Sheets

TRANSMITTING APPARATUS, TRANSMITTING METHOD, AND PROGRAM

BACKGROUND OF THE INVENTION

1. Field of the Invention

The present invention relates to an apparatus and method for transmitting image data.

2. Description of the Related Art

With recent improvements of performance in communication environment and data processing environment as a backdrop, a streaming technology for distributing multimedia data, such as movie images and audio data, in real time through a network is in practical use. The practical use of such a steaming technology enables a user to view broadband broadcasting on a live medium or a recorded medium and to view it on a recorded medium on demand.

For this service, a technology for correcting an error occurring in, for example, a communication path, at a receiving apparatus is important.

One example of the technology for correcting an error at a receiving apparatus is forward error correction (FEC). FEC is a technique of transmitting redundant data for use in error correction from an image data sender to a receiver and correcting an error of the image data using the redundant data at the receiver.

Japanese Patent No. 3831558, corresponding to U.S. Pat. No. 6,317,462, describes a technique in which an encoder splits a video signal into a high priority partition and a low priority partition, the high priority partition data with redundant data for use in error correction being added is transmitted, and the low priority partition data is transmitted without redundant data. In this technique, the distinction between the high priority partition and the low priority partition is determined by the frame type of each frame (inter-frame coding I frame, prediction P frame, and prediction B frame).

However, if an error occurs in data of a frame to which no redundant data for use in error correction is added, correction using redundant data cannot be performed, and this may result in a decrease in the image quality.

That is, if an error occurs in B-frame data that is determined as low priority in accordance with the frame type, for example, correction using redundant data cannot be performed, and this may result in a decrease in the image quality of a reproduced image.

SUMMARY OF THE INVENTION

The present invention provides a transmitting method capable of suppressing a decrease in the image quality caused by a communication error of image data without having to significantly increase the amount of the data.

According to an aspect of the present invention, a transmitting apparatus for transmitting redundant data usable in correction of an error of image data by a receiving apparatus together with the image data to the receiving apparatus is provided. The transmitting apparatus includes a calculating unit, a determining unit, and a transmitting unit. The calculating unit is configured to calculate an amount of change between frames of an image in a predetermined display range in images corresponding to the image data. The determining unit is configured to, when the amount of change is a first value, determine a number of data of the redundant data such that the number of data of the redundant data for image data of the image in the predetermined display range is larger than a number of the redundant data occurring when the amount of change is a second value being smaller than the first value.

The transmitting unit is configured to transmit the redundant data based on the determined number of data of the redundant data together with the image data of the image in the predetermined display range.

Further features of the present invention will become apparent from the following description of exemplary embodiments with reference to the attached drawings.

DESCRIPTION OF THE EMBODIMENTS

Embodiments of the present invention are described below with reference to the accompanying drawings.

Figure 1:
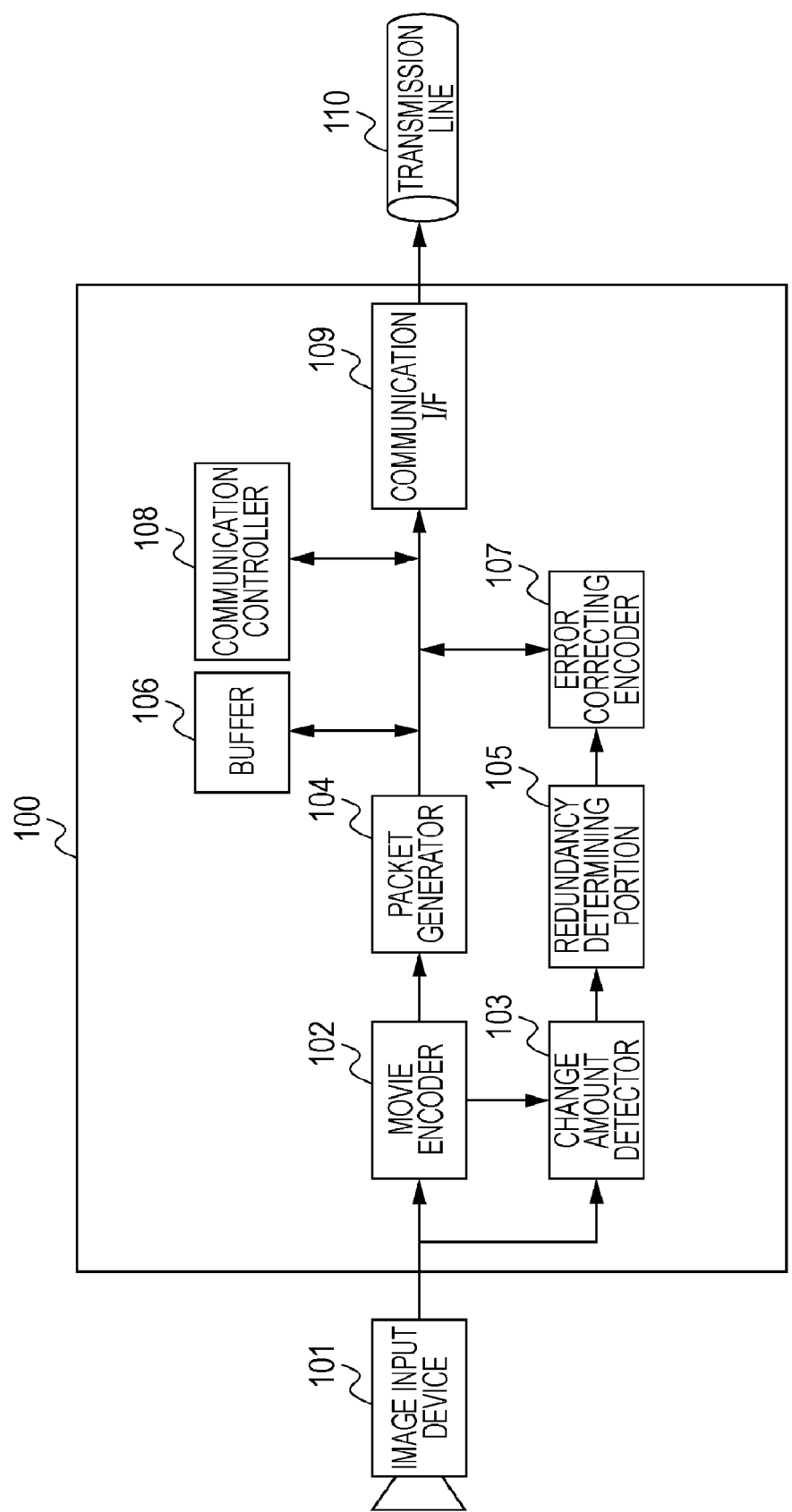
FIG. 1 is a block diagram that illustrates an example of functional configuration of a transmitting apparatus according to an embodiment of the present invention.

FIG. 1 is a block diagram that illustrates an example of functional configuration of a transmitting apparatus 100 according to an embodiment of the present invention.

The transmitting apparatus 100 transmits redundant data (FEC data) usable for correcting an error occurring in image data by a receiving apparatus together with the image data. The transmitting apparatus 100 is achievable by a personal computer, a work station, a notebook PC, various kinds of household electrical products incorporating a computer, a game machine, a cellular phone, a digital camcorder, a digital camera, and any combination of these devices. In the present embodiment, an example case where the transmitting apparatus 100 transmits movie data to a receiving apparatus is described.

As illustrated in FIG. 1, the transmitting apparatus 100 includes a movie encoder 102, a change amount detector 103, a packet generator 104, a redundancy determining portion 105, a buffer 106, an error correcting encoder 107, a communication controller 108, and a communication interface 109.

Referring to FIG. 1, a transmission line 110 can be represented by various networks and, in the present embodiment, is a network used in transmitting and receiving packets of movie data (RTP packets). RTP packets are packets of movie data conforming to real-time transport protocol (RTP) used as a protocol for use in transmission of movie data by the transmitting apparatus 100.

The movie encoder 102 encodes movie data input from an image input device 101 (e.g., a camcorder, a webcam) using moving picture experts group phase 4 (MPEG-4) coding. Movie data input into the movie encoder 102 is not limited to that input from a camera and may also be input from a server on a network or a hard disk that stores movie data. The movie encoder 102 may also encode data using MPEG-2 or H.264 (MPEG-4 AVC) coding. Movie data encoded by the movie encoder 102 is input to the packet generator 104. The movie encoder 102 can also input the encoded movie data to the change amount detector 103 if needed.

The packet generator 104 packets the movie data encoded by the movie encoder 102 and causes the buffer 106 to store the packeted movie data (RTP packets). The buffer 106 is a buffer for temporarily storing an RTP packet and FEC packet, which is described below. In the present embodiment, the transmitting apparatus 100 uses MPEG-4 video coding as the method for coding movie data and uses RTP as the protocol for use in transmitting movie data. In the present embodiment, the packet generator 104 packets encoded movie data in accordance with RFC 3550, which specifies RTP payload format for movie data. However, other forms can also be used.

The change amount detector 103 calculates the amount of change in movie data input from the image input device 101 for each predetermined display range. Examples of the predetermined display range include a stream, group of picture (GOP), frame, slice, and video packet of a movie image. In the present embodiment, the amount of change indicates the amount of change between an image of a frame where movie data is present and an image of a frame to be reproduced prior thereto. The change amount detector 103 informs the redundancy determining portion 105 of the calculated amount of change.

That is, the change amount detector 103 calculates the amount of change between frames of an image within a predetermined display range in images corresponding to image data.

The details of the amount of change calculated by the change amount detector 103 will be described below.

The redundancy determining portion 105 determines error-correcting coding rate (FEC redundancy) in the predetermined display range in which the amount of change is calculated, in response to the amount of change informed by the change amount detector 103. An error-correcting coding rate indicates the rate of the number of data of FEC data (number of FEC packets) to the number of data of movie data (number of RTP packets). That is, for example, when four RTP packets correspond to one FEC packet, the error-correcting coding rate is 20%. FEC data (redundant data) can be data for use in error correction transmitted to a receiving apparatus to allow movie data in which an error occurs in a communication path to be corrected by the receiving apparatus. The details of a method for determining the error-correcting coding rate by the redundancy determining portion 105 will be described below.

The error correcting encoder 107 reads a plurality of RTP packets stored in the buffer 106 in response to the error-correcting coding rate informed by the redundancy determining portion 105 and generates an FEC packet from the plurality of RTP packets. The error correcting encoder 107 causes the buffer 106 to store the generated FEC packet.

The communication controller 108 controls the communication path and the communication protocol used for transmitting movie data and also controls transmission of an RTP packet and an FEC packet stored in the buffer 106. The communication interface 109 is used in transferring data between computer systems through the transmission line 110. That is, an RTP packet and an FEC packet stored in the buffer 106 are transmitted toward a predetermined destination (receiving apparatus) by the communication controller 108 through the communication interface 109.

That is, the communication controller 108 transmits the redundant data together with image data (movie data) in a predetermined range in accordance with the number of data of the determined redundant data.

A process performed by the transmitting apparatus 100 according to the present embodiment will now be described with reference to FIG. 2.

Figure 2:
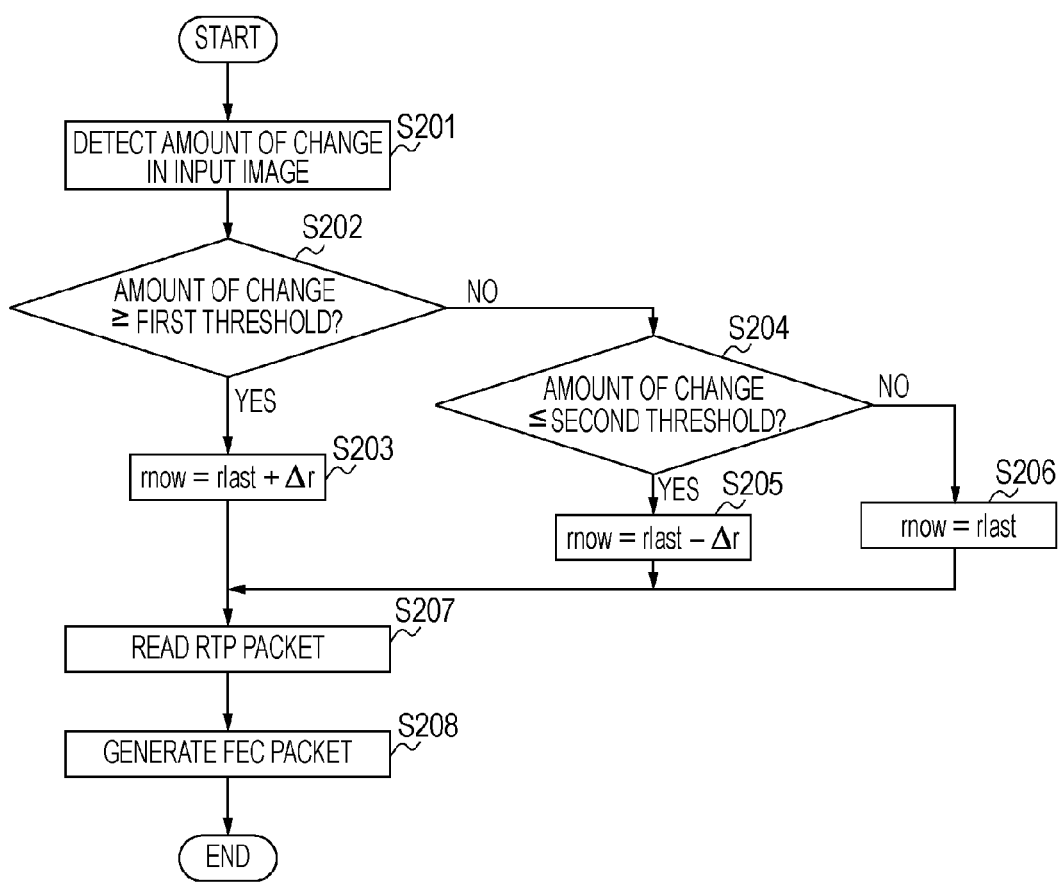
FIG. 2 is a flowchart that illustrates an example of a process for generating an FEC packet by the transmitting apparatus according to the embodiment of the present invention.

In step S201 of FIG. 2, the change amount detector 103 detects the amount of change in a predetermined display range in movie data input from the image input device 101. In the present embodiment, the amount of change is a parameter that indicates the difference between an image of a frame in which movie data is present and an image of a frame to be reproduced prior thereto.

In other words, in step S201 (calculation step), the change amount detector 103 calculates the amount of change between frames of an image in a predetermined display range in images corresponding to image data.

Examples of the predetermined display range are a stream, GOP, frame, slice, and video packet of a movie image. In the present embodiment, the change amount detector 103 detects the amount of change on a frame-by-frame basis. That is, the change amount detector 103 receives encoded movie data from the movie encoder 102. The change amount detector 103 then refers to a motion vector added for each macroblock in the predetermined display range (frame) and calculates the number of macroblocks each having a motion and the sum of the magnitudes of the motions for each frame. If information on a motion vector is added in units other than a macroblock, the motion vector may also be referred to in units other than a macroblock.

That is, the change amount detector 103 calculates the amount of change in accordance with information indicating the distance between an image in a predetermined display range in a first frame and an image in a corresponding predetermined display range in a second frame referred to in order to encode the image in the predetermined display range in the first frame. Examples of the predetermined display range are a stream, GOP, frame, slice, and video packet of a movie image. If the predetermined display range is a GOP, for example, the change amount detector 103 refers to a motion vector added for each macroblock in each of a plurality of frames belonging to each GOP. The change amount detector 103 calculates the number of macroblocks each having a motion and the sum of the magnitudes of the motions for each GOP.

The method for calculating the amount of change by the change amount detector 103 is not limited to referring to a motion vector. A method other than referring to a motion vector will be described below.

The change amount detector 103 informs the redundancy determining portion 105 of the amount of change in the predetermined display range.

When receiving the amount of change from the change amount detector 103, the redundancy determining portion 105 determines whether the amount of change is equal to or larger than a first threshold being a threshold corresponding to an increase in error-correcting coding rate (FEC redundancy) in step S202. As described above, the error-correcting coding rate indicates the number of data of redundant data (number of FEC packets) to the number of data of movie data (number of RTP packets). For example, when one FEC packet is generated for four RTP packets, the error-correcting coding rate is 1/5 (20%). In the present embodiment, the change amount detector 103 calculates the number of macroblocks each having a motion from among macroblocks in a frame and the sum of the magnitudes of the motions as the amount of change. In the present embodiment, the redundancy determining portion 105 sets the first threshold at which the number of macroblocks each having a motion is the number corresponding to a predetermined rate of macroblocks in the predetermined display range (frame), for example, 80% and the sum of the magnitudes of the motions is the vertical length of the frame. That is, when at least 80% of the macroblocks in a frame moves their display positions between frames and the sum of the movements exceeds a predetermined length, for example, the vertical length of the frame, the redundancy determining portion 105 increases the error-correcting coding rate. However, the method for setting the first threshold is not limited to the above method. For example, the redundancy determining portion 105 may set the first threshold based on either the number of macroblocks each having a motion or the sum of the magnitudes of the motions. Alternatively, the first threshold may also be set and changed by a user.

When in step S202 the amount of change is equal to or larger than the first threshold (YES in step S202), flow proceeds to step S203. In step S203, the redundancy determining portion 105 determines the value in which Δr is added to the current error-correcting coding rate rlast as a new error-correcting coding rate rnow (rnow=rlast+Δr). For example, when the current error-correcting coding rate rlast is ⅑, this means that the error correcting encoder 107 has generated one FEC packet for eight RTP packets in a frame to be previously transmitted. In this case, the redundancy determining portion 105 determines the error-correcting coding rate rnow by processing of step S203 such that two FEC packets will be generated for eight RTP packets in a frame to be subsequently transmitted, for example. As a result, the error-correcting coding rate rnow is ⅕. The error correcting encoder 107 generates one FEC packet for four RTP packets, for example. That is, Δr is the value indicating how much to increase the number of FEC packets to be added for RTP packets in the predetermined display range when the amount of change is equal to or larger than the first threshold.

That is, in step S203, when the amount of change is a first value, the redundancy determining portion 105 determines the number of data of redundant data in the predetermined display range as being larger than that occurring when the amount of change is a second value being smaller than the first value.

In step S203, when the amount of change is the first value, the redundancy determining portion 105 adds a predetermined number of data (Δr) to the number of data of redundant data for the image data.

The first value corresponds to the first threshold, and the second value corresponds to a second threshold. The second threshold will be described below. That is, the redundancy determining portion 105 determines the number of data of redundant data such that, when the amount of change is equal to or larger than the first threshold, the number of data of redundant data (number of FEC packets) for the number of data of movie data (RTP packets) in the predetermined display range at which the amount of change is calculated is increased. In the present embodiment, when the amount of change is the first value, the number of data of redundant data for movie data is increased by a predetermined number of data. In such a way, the error-correcting coding rate can be prevented from being radically changed.

When the error-correcting coding rate rlast has already reached an upper limit (e.g., ½), step S203 is omitted. The error-correcting coding rate at the start of transmission may be set at any value. The state where the error-correcting coding rate reaches ½ (50%) corresponds to the state where the same packets are transmitted two by two.

When in step S202 the amount of change is smaller than the first threshold (NO in step S202), flow proceeds to step S204. In step S204, the redundancy determining portion 105 determines whether the amount of change is equal to or smaller than the second threshold, which is the threshold for a reduction in the error-correcting coding rate. The second threshold is smaller than the first threshold. In the present embodiment, the redundancy determining portion 105 sets in advance the second threshold as described below. That is, the redundancy determining portion 105 sets the second threshold at which the number of macroblocks each having a motion from among the macroblocks in a frame is the number corresponding to a predetermined rate, for example, 10%. In other words, when at least 90% of the macroblocks in a frame does not move their display positions between frames, the redundancy determining portion 105 decreases the error-correcting coding rate. When in step S204 the amount of change is equal to or smaller than the second threshold (YES in step S204), flow proceeds to step S205. In step S205, the redundancy determining portion 105 determines the value in which Δr is subtracted from the current error-correcting coding rate rlast as the new error-correcting coding rate rnow (rnow=rlast−Δr). For example, it is assumed that the current error-correcting coding rate rlast is ¼, that is, the current error-correcting coding rate is set such that two FEC packets are generated for eight RTP packets in a frame to be previously transmitted. In this case, the redundancy determining portion 105 determines the error-correcting coding rate rnow by processing of step S205 such that one FEC packet will be generated for eight RTP packets in a frame to be subsequently transmitted, for example. In other words, Δr is the value indicating how much to decrease the number of FEC packets to be added for RTP packets in the predetermined display range when the amount of change is less than the second threshold. The value of Δr used in step S203 and that in step S205 may be different. When the error-correcting coding rate rlast has already reached a lower limit (e.g., ⅑), S203 is omitted.

When in step S204 the amount of change is larger than the second threshold, i.e., the amount of change is between the first threshold and the second threshold (NO in step S204), the redundancy determining portion 105 moves flow to step S206. For example, when the number of macroblocks each having a motion from among the macroblocks in the predetermined display range (frame) is the number corresponding to a predetermined rate between 10% and 80%, for example, the redundancy determining portion 105 moves flow to step S206. The redundancy determining portion 105 also moves flow to step S206 when the number of macroblocks each having a motion from among the macroblocks in a frame is equal to or larger than 80% and the sum of the magnitudes of the motions is smaller than a predetermined length, for example, the vertical length of the frame.

In step S206, the redundancy determining portion 105 determines the current error-correcting coding rate rlast as the new error-correcting coding rate rnow (rnow=rlast). In other words, when the amount of change is a value between the first threshold and the second threshold, the amount of change remains the same.

The first threshold and the second threshold may be set at any value. These values can be set based on experience or set at an optimal value in accordance with the capability of the error concealment at the receiving apparatus or the image quality after the error concealment. Any value can be used as the magnitude of increase or decrease Δr for the error-correcting coding rate. For example, a statically optimal value in consideration of the rate of increase or decrease and the advantages obtained therefrom can be set as Δr.

In the present embodiment, by comparison between the detected amount of change and the threshold, the error-correcting coding rate is increased or decreased by the predetermined value Δr. However, the error-correcting coding rate may be determined without consideration of the error-correcting coding rate for a previous frame. For example, the redundancy determining portion 105 can determine the error-correcting coding rate rnow as ⅕, irrespective of the current error-correcting coding rate rlast, when the amount of change in a frame is larger than the first threshold. That is, the error-correcting coding rate can be determined such that the error correcting encoder 107 will generate four FEC packets for 16 RTP packets in a frame, for example. When the amount of change in that frame is between the first threshold and the second threshold, for example, the redundancy determining portion 105 can determine the error-correcting coding rate as ⅑ irrespective of the current error-correcting coding rate. That is, the error-correcting coding rate can be determined such that the error correcting encoder 107 will generate two FEC packets for 16 RTP packets, for example. When the amount of change is smaller than the second threshold, the redundancy determining portion 105 can determine the error-correcting coding rate as 1/17, for example. That is, the error-correcting coding rate can be determined such that the error correcting encoder 107 will generate one FEC packet for 16 RTP packets. In such a way, the redundancy determining portion 105 can determine the new error-correcting coding rate irrespective of the error-correcting coding rate in a previous frame, so it can determine the error-correcting coding rate that matches the detected amount of change well.

In the present embodiment, the error-correcting coding rate is determined in comparison with the two thresholds. Alternatively, the error-correcting coding rate may also be determined using more thresholds.

The error-correcting coding rate determined by the redundancy determining portion 105 in step S203, S205, or S206 is informed to the error correcting encoder 107 in that step. In step S207, the error correcting encoder 107 reads a plurality of RTP packets stored in the buffer 106 in accordance with the error-correcting coding rate.

In step S208 (transmission step), the error correcting encoder 107 generates an FEC packet from the read plurality of RTP packets. As described above, the number of RTP packets necessary for generation of an FEC packet is determined in accordance with the derived error-correcting coding rate. More specifically, when the error-correcting coding rate is low, an FEC packet is generated from many RTP packets. In contrast, when the error-correcting coding rate is high, an FEC packet is generated from a few RTP packets.

The FEC packet generated by the error correcting encoder 107 is stored in the buffer 106.

In step S208 (transmission step), the communication controller 108 transmits the FEC packet stored in the buffer 106 toward a predetermined destination through the communication interface 109.

In other words, in step S208 (transmission step), the communication controller 108 transmits data containing the RTP packets (image data) and FEC packet (redundant data) in accordance with the determined error-correcting coding rate.

The RTP payload format for FEC is specified by RFC 2733. Example types of FEC are turbo code, convolutional code, and block code. In the present embodiment, any type can be used.

The reason for determination of the error-correcting coding rate in accordance with the amount of change in movie data as in the present embodiment is described below. In general, the effectiveness (the degree of difficulty) of error concealment varies by the amount of change in an image. A case where an image corresponding to an RTP packet in which an error occurs is reproduced using data of a frame to be reproduced prior to a frame that contains the error is discussed below. In this case, if the image corresponding to the RTP packet in which the error occurs is significantly different from the image corresponding to the frame to be reproduced prior to the frame containing the error, a displayed image would be largely different from an image that should be displayed originally as a result of error concealment. In contrast, if the image corresponding to the RTP packet in which the error occurs is slightly different from the image corresponding to the frame to be reproduced prior to the frame containing the error, error concealment enables a displayed image to be close to an image that should be displayed originally. Thus, when the amount of change in an image is small, the redundancy determining portion 105 decreases the error-correcting coding rate such that the principal error handling function is error concealment at the receiving apparatus. In such a way, the used communication band can be reduced. In addition, as a result of such a reduction, the communication band can be efficiently assigned to movie data. In contrast, when the amount of change in an image is large, because the effectiveness of error concealment is low, the redundancy determining portion 105 increases the error-correcting coding rate such that the principal error handling function is error concealment is error correction using FEC data. In such a way, a decrease in image quality caused by communication error in movie data can be suppressed.

Figure 3:
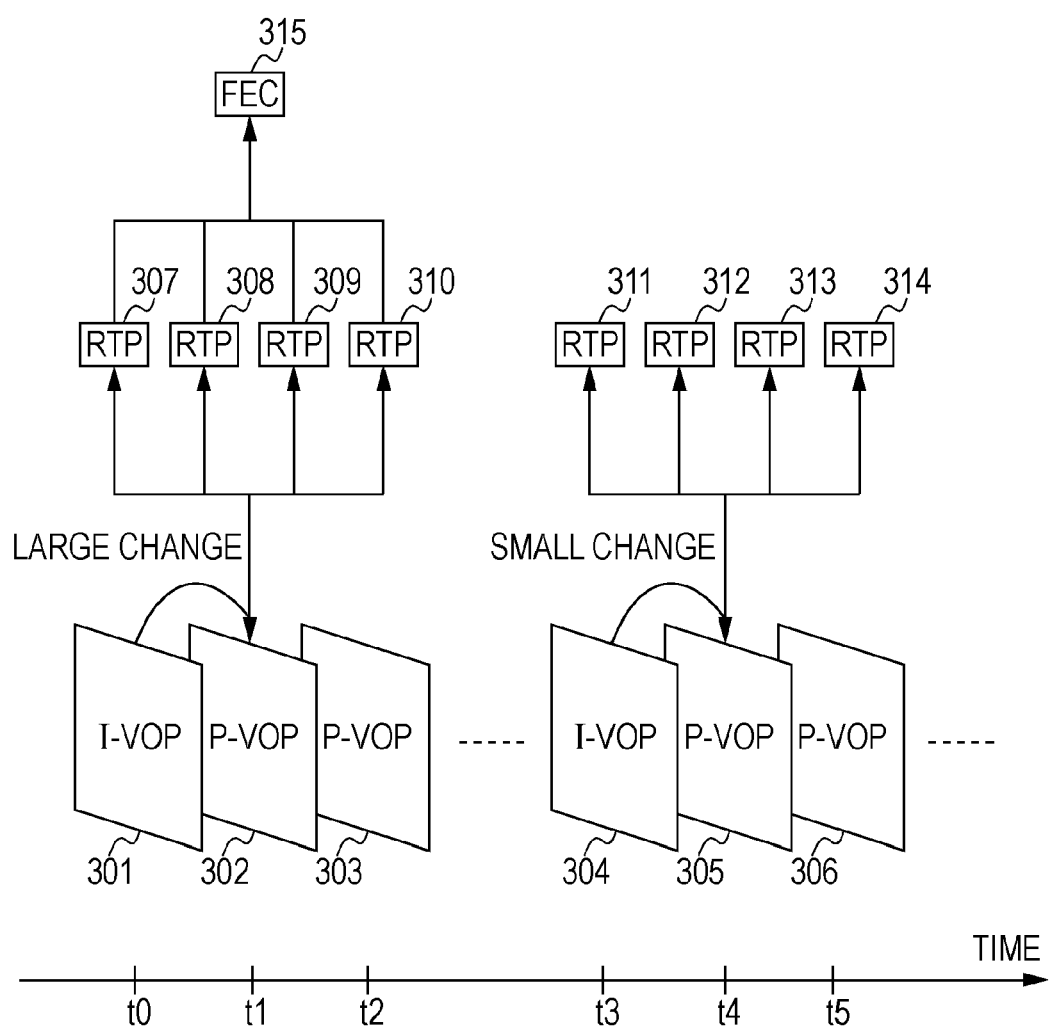
FIG. 3 illustrates a relationship among movie frames, RTP packets, and FEC packets according to the embodiment of the present invention.

A relationship between movie data and redundant data (FEC data) in accordance with the error-correcting coding rate determined by the redundancy determining portion 105 will be described next with reference to FIG. 3. FIG. 3 illustrates the relationship among movie frames encoded by the movie encoder 102, RTP packets generated by the packet generator 104, and an FEC packet generated by the error correcting encoder 107 in the transmitting apparatus 100 according to the present embodiment with time. For the sake of simplification of description, the change amount detector 103 detects the amount of change on a frame-by-frame basis, and the redundancy determining portion 105 determines the error-correcting coding rate on a frame-by-frame basis.

Frames 301 to 306 are frames of a movie image encoded by the movie encoder 102. Each of the frame 301 encoded at time t0 and the frame 304 encoded at time t3 is an intra-coded frame (I-VOP). Each of the frames 302, 303, 305, and 306 encoded at time t1, time t2, time t4, and time t5, respectively, is an inter-frame prediction coded frame (P-VOP). Each of the P-VOPs is a frame in which the difference from the current frame is encoded based on the immediately preceding frame. Although frames are present between time t2 and time t3 and after time t5, these frames are not illustrated in FIG. 3.

In the present embodiment, the movie frames 301 to 306 are input into the packet generator 104 on a frame-by-frame basis, and packeted by the packet generator 104, and stored in the buffer 106. For example, the frame 302 encoded at time t1 is formed into four RTP packets 307 to 310 by the packet generator 104. Similarly, the frame 305 encoded at time t4 is formed into four RTP packets 311 to 314 by the packet generator 104. Although each of the frames 301, 303, 304, and 306 and frames that are not illustrated are also formed into RTP packets, these RTP packets are not illustrated in FIG. 3.

It is assumed that the current error-correcting coding rate rlast at the time of determining the error-correcting coding rate for the frame 302 is ⅙. That is, the error correcting encoder 107 generates one FEC packet for five RTP packets in the frame 301. This indicates that in step S202 of FIG. 2 the redundancy determining portion 105 determines that the amount of change from the reference frame 301 to the frame 302 is larger than the first threshold and determines the new error-correcting coding rate rnow as ⅕. That is, the redundancy determining portion 105 determines that error-correcting coding rate for the frame 302 such that one FEC packet will be generated for four RTP packets. In general, because I-VOP has the amount of data larger than that of P-VOP, the number of RTP packets for each frame is also larger. In the present embodiment, the number of RTP packets in the frame 301 is larger than that in the frame 302.

When the number of RTP packets in the frame 301 is a multiple of 5, for example, the error correcting encoder 107 can generate one FEC packet for five RTP packets in accordance with the error-correcting coding rate (⅕) determined for the frame 301. In contrast, when the number of RTP packets in the frame 301 is not a multiple of 5, if FEC packets are generated in accordance with the determined error-correcting coding rate, an RTP packet that cannot be subjected to error correction using FEC data may be produced.

For example, when the number of RTP packets in the frame 301 is 18 and the error-correcting coding rate is ⅙, error correction using FEC data may be unable to be performed on three RTP packets from among the RTP packets in the frame 301. To avoid this, in the present embodiment, the error correcting encoder 107 generates FEC packets using the error-correcting coding rate (⅙) determined by the redundancy determining portion 105 with respect to 15 RTP packets from among 18 RTP packets. The error correcting encoder 107 generates one FEC packet with respect to the remaining three RTP packets. In such a way, the occurrence of an RTP packet that cannot be subjected to error correction using FEC data can be prevented by changing the error-correcting coding rate for each predetermined display range.

When the error-correcting coding rate determined for the frame 301 is ⅙ and the number of RTP packets in the frame 301 is 18, the error correcting encoder 107 may change the error-correcting coding rate to ¼. In such a manner, the error correcting encoder 107 may change the error-correcting coding rate determined in accordance with the amount of change in a predetermined display range, in accordance with the number of RTP packets in the predetermined display range. In such a case, it is useful that the error-correcting coding rate be changed so as to be increased. Also in this case, the occurrence of an RTP packet that cannot be subjected to error correction using FEC data can be prevented by changing the error-correcting coding rate for each predetermined display range. The number of FEC packets for the number of RTP packets can be averaged.

In FIG. 3, for the frame 305 and its subsequent frames, the amount of change between frames is small, and the error-correcting coding rate in the frame 305 is determined as zero. As described above, the redundancy determining portion 105 of the transmitting apparatus 100 according to the present embodiment determines the error-correcting coding rate in accordance with the amount of change in an input movie image. Thus, the redundancy determining portion 105 determines the error-correcting coding rate as, for example, 20% (⅕) with respect to the frame 302, which has a large amount of change. The error correcting encoder 107 generates one FEC packet 315 from the four RTP packets 307 to 310 in accordance with the determined error-correcting coding rate. In contrast, the redundancy determining portion 105 determines the error-correcting coding rate as 0% with respect to the frame 305, which has a small amount of change, in order to perform error handling using the error concealment function of the receiving apparatus. The error correcting encoder 107 generates no FEC packet from the RTP packets 311 to 314.

The error-correcting coding rate is determined for other frames in a similar way. The description thereof is not repeated here.

An example configuration of the whole of a system that contains the transmitting apparatus 100 according to the present embodiment will be described next with reference to FIG. 4.

Figure 4:
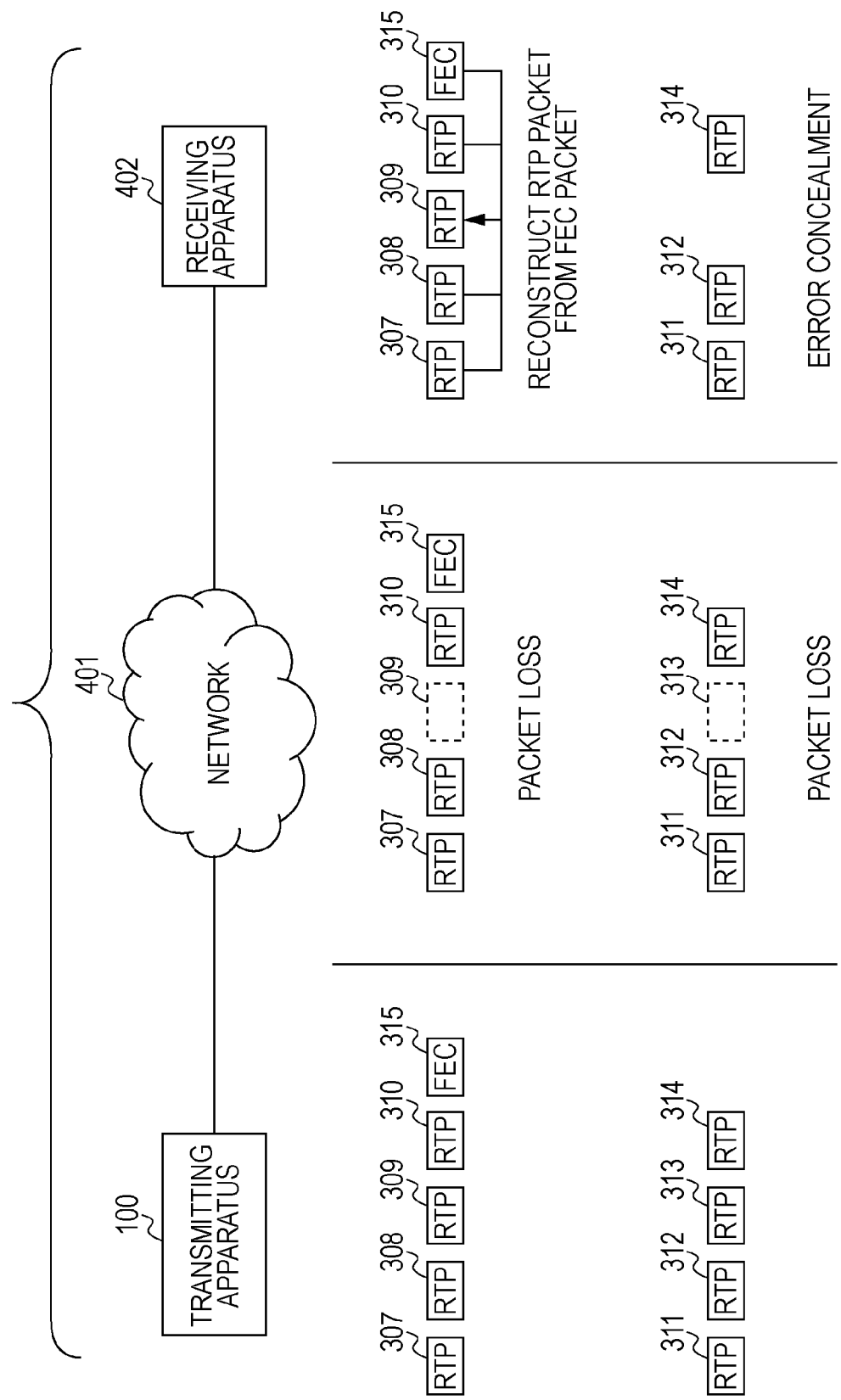
FIG. 4 illustrates an example of configuration of a system according to the embodiment of the present invention.

Referring to FIG. 4, the transmitting apparatus 100 is connected to a receiving apparatus 402 through a network 401. The receiving apparatus 402 has the error concealment function. That is, the receiving apparatus 402 has the function of reproducing at a display position corresponding to movie data in which an error occurs using data of an image adjacent to the display position or data of an image of another frame.

The transmitting apparatus 100 transmits the RTP packets 307 to 314 and the FEC packet 315 illustrated in FIG. 3 to the receiving apparatus 402. In the present embodiment, the FEC packet 315 is generated using the four RTP packets 307 to 310. However, the ratio between RTP packets and FEC packets can be changed in accordance with the amount of change in an input movie image.

If the RTP packet 309 is lost by an error occurring on the network, the receiving apparatus 402 can recover (correct) the RTP packet 309 using the normally received RTP packets 307, 308, and 310 and FEC packet 315. Accordingly, the frame 302 can be normally formed from the RTP packets 307 to 310, and decoding and reproducing can be performed. The frame 302 formed from the RTP packets 307 to 310 is largely changed from the reference frame 301. Thus, error correction using error correction coding is more effective than that using error concealment.

If the RTP packet 313 is lost by an error occurring on the network, although the receiving apparatus 402 cannot receive the RTP packet 313, the receiving apparatus 402 can receive the RTP packets 311, 312, and 314 and reproduce an image using error concealment. The frame 305 formed from the RTP packets 311 to 314 is slightly changed from the reference frame 304. Thus, error concealment that interpolates the region of the RTP packet 313 in the frame 305 using a macroblock present at the same position in the reference frame 304 is effective.

That is, in the present embodiment, the change amount detector 103 detects the amount of change between frames of an image in a predetermined display range in images corresponding to image data. The redundancy determining portion 105 determines that the effectiveness of error concealment is high when the detected amount of change is small, and determines the error-correcting coding rate such that the amount of data of redundant data (the number of FEC packets) for the amount of data of movie data (the number of RTP packets) is reduced. In contrast, when the amount of change is large, the redundancy determining portion 105 determines that the effectiveness of error concealment is low, and determines the error-correcting coding rate such that the amount of data of redundant data (the number of FEC packets) for the amount of data of movie data (the number of RTP packets) is increased.

As described above, according to the transmitting apparatus 100 in the present embodiment, controlling the error-correcting coding rate in accordance with the effectiveness of error concealment function enables, even if a communication error occurs, the communication band to be efficiently used while at the same time the image quality of a movie image is maintained.

In the present embodiment, the amount of change is calculated using a motion vector. However, various methods for calculating the amount of change can also be used. There are a plurality of error concealment methods performed by the receiving apparatus. The use of a method for calculating the amount of change in accordance with the type of error concealment can achieve greater advantages of the present invention. Examples of an error concealment method and a method for calculating the amount of change in accordance with that error concealment method are described below.

A first error concealment method is the method for concealing an error in reproduction at a display position corresponding to movie data in which the error occurs by employing image data at the same display position as the display position of the movie data in which the error occurs in a frame to be reproduced prior to a frame that contains the error. To allow the receiving apparatus to perform such error concealment, the change amount detector 103 calculates the difference between movie data in a predetermined display range and movie data at the same display position in a preceding frame. That is, the change amount detector 103 calculates the amount of change in accordance with the difference value between frames in a predetermined display range in step S201 (calculation step). When the calculated difference is smaller than a predetermined value, the redundancy determining portion 105 decreases the error-correcting coding rate such that the principal error handling function is the error concealment function of the receiving apparatus. In contrast, when the calculated difference is larger than the predetermined value, the redundancy determining portion 105 increases the error-correcting coding rate such that the principal error handling function is the error correction function using FEC data.

When the amount of change is a first value, in step S203 (determination step), the redundancy determining portion 105 determines the number of data of redundant data such that the number of data of redundant data for image data in the predetermined display range is larger than that occurring when the amount of change is a second value being smaller than the first value. With this method, when an error occurs, the error-correcting coding rate is determined in accordance with the difference from image data actually used in error concealment function. Thus, the effectiveness of the error concealment function can be evaluated more accurately.

A second error concealment method is the method for concealing an error in reproduction at a display position corresponding to movie data in which the error occurs by employing image data at the same display position as the display position of the movie data in which the error occurs in frames to be reproduced prior to and subsequent to a frame that contains the error. To allow the receiving apparatus to perform such error concealment, the change amount detector 103 calculates the difference between movie data in a predetermined display range and movie data at the same display position in its preceding frame and the difference between the movie data in the predetermined display range and movie data at the same display position in its subsequent frame and calculates the sum of the absolute values of the differences and the mean value thereof. That is, the change amount detector 103 calculates the amount of change between frames of an image in a predetermined display range in images corresponding to image data in step S201 (calculation step).

When the calculated value is smaller than a predetermined value, the redundancy determining portion 105 decreases the error-correcting coding rate such that the principal error handling function is the error concealment function performed by the receiving apparatus. In contrast, when the calculated value is larger than the predetermined value, the redundancy determining portion 105 increases the error-correcting coding rate such that the principal error handling function is the error correction function using FEC data. That is, when the amount of change is a first value, in step S203 (determination step), the redundancy determining portion 105 determines the number of data of redundant data such that the number of data of redundant data for image data in the predetermined display range is larger than that occurring when the amount of change is a second value being smaller than the first value. In such a way, even if the receiving apparatus performs error concealment using data of prior and subsequent frames, the effectiveness of the error concealment can be evaluated more accurately.

A third error concealment method is the method for concealing an error in reproduction at a display position corresponding to movie data in which the error occurs by employing movie data adjacent to the display position. That is, the receiving apparatus conceals an error employing one or more movie data adjacent to a display position corresponding to movie data in which the error occurs. To allow the receiving apparatus to perform such error concealment, the change amount detector 103 calculates the difference between movie data in a predetermined display range and movie data adjacent to the display position. That is, the change amount detector 103 calculates the difference between the image in the predetermined display range and image in its adjacent display range in step S201 (calculation step). When the calculated difference is smaller than a predetermined value, the redundancy determining portion 105 decreases the error-correcting coding rate such that the principal error handling function is the error concealment function performed by the receiving apparatus. In contrast, when the calculated value is larger than the predetermined value, the redundancy determining portion 105 increases the error-correcting coding rate such that the principal error handling function is the error correction function using FEC data.

That is, when the difference is a first value, in step S202 (determination step), the redundancy determining portion 105 determines the number of data of redundant data such that the number of data of redundant data for image data in the predetermined display range is larger than that occurring when the difference is a second value being smaller than the first value. Each of the first and second values is a threshold that can be freely set. The communication controller 108 transmits the redundant data based on the number of data of redundant data determined by the redundancy determining portion 105 together with image data in the predetermined display range (RTP packets) in step S208 (transmission step). In such a way, also when the receiving apparatus conceals an error employing image data adjacent to the display position in the same frame, the effectiveness of the error concealment can be evaluated more accurately.

A fourth error concealment method is the method for concealing an error by estimating an image at a display position corresponding to movie data in which the error occurs by detecting an edge from movie data adjacent to the display position. That is, if a part of an image is lost, the error is concealed by estimation of the image of the part from its adjacent image data. To allow the receiving apparatus to perform such error concealment, the change amount detector 103 calculates regularity of an image in a predetermined display range by image analysis.

When the calculated regularity is smaller than a predetermined value, the redundancy determining portion 105 decreases the error-correcting coding rate such that the principal error handling function is the error concealment function performed by the receiving apparatus. In contrast, when the calculated regularity is larger than the predetermined value, the redundancy determining portion 105 increases the error-correcting coding rate such that the principal error handling function is the error correction function using FEC data. In such a way, also when the error concealment method is the method of estimating an image corresponding to an error by employing image data adjacent to a display position in the same frame, the effectiveness of the error concealment can be evaluated more accurately.

A fifth error concealment method is the method for concealing an error by estimating a motion vector of movie data in which the error occurs from information indicating a motion vector contained in movie data adjacent to the display position of the movie data in which the error occurs and using movie data of another frame in accordance with the estimated motion vector. To allow the receiving apparatus to perform such error concealment, the change amount detector 103 calculates both the amount of change using the motion vector and the evaluated value indicting the degree of uniformity of directions of the motions in macroblocks in which a predetermined display range is divided. When the amount of change calculated by referring to the motion vector is larger than a predetermined value, the redundancy determining portion 105 increases the error-correcting coding rate. In contrast, when the calculated amount of change is smaller than the predetermined value, the redundancy determining portion 105 decreases the error-correcting coding rate. This is because, when an image to be encoded and an image to be referred to are remote from each other on the display screen, for example, because there is a high possibility that the difference between the images is large, the effectiveness of the error concealment is determined as being low. This processing is substantially the same as the flowchart of FIG. 2.

In addition, when the calculated evaluated value of the degree of uniformity is smaller than a predetermined value, the redundancy determining portion 105 increases the error-correcting coding rate. That is, the redundancy determining portion 105 detects a plurality of directions by referring to the motion vector of each of macroblocks in a predetermined display range. When the degree of uniformity is determined as being lower than the predetermined value, the redundancy determining portion 105 sets the error-correcting coding rate as being higher than that occurring when the amount of change is the same and the degree of uniformity of directions of the motions is determined as being higher than the predetermined value. For example, the value of Δr used in step S203 of FIG. 2 is increased.

That is, normally, in step S203, the redundancy determining portion 105 determines the error-correcting coding rate such that the number of FEC packets for the number of RTP packets in a predetermined display range is incremented by one by adding Δr to the error-correcting coding rate rlast. However, when the evaluated value of directions of the motions is determined as being smaller than a predetermined value, the redundancy determining portion 105 determines the error-correcting coding rate such that the number of FEC packets for the number of RTP packets in the predetermined display range is further incremented by one. In this case, in step S203, the number of FEC packets is incremented by two. For example, when the error-correcting coding rate is set such that the error-correcting coding rate rlast is 1/17, i.e., one FEC packet is generated for 16 packets, the error-correcting coding rate rnow determined in step S203 is 3/19. The error correcting encoder 107 generates three FEC packets for 16 RTP packets.

In contrast, when the calculated evaluated value of the degree of uniformity is higher than the predetermined value, the redundancy determining portion 105 decreases the error-correcting coding rate. That is, when determining that the degree of uniformity of directions of macroblocks in a predetermined display range is higher than the predetermined value, the redundancy determining portion 105 sets the error-correcting coding rate as being higher than that occurring when the amount of change is the same and the degree of uniformity of directions of the motions is determined as being smaller than the predetermined value. For example, the value of Δr used in step S203 of FIG. 2 is reduced. That is, normally, in step S203, the redundancy determining portion 105 determines the error-correcting coding rate such that the number of RTP packets for the number of FEC packets is decremented by one by adding Δr to the error-correcting coding rate rlast. However, when the evaluated value of directions of the motions is determined as being larger than a predetermined value, the redundancy determining portion 105 determines the error-correcting coding rate such that the number of RTP packets for the number of FEC packets is incremented by one. In this case, in step S203, the number of RTP packets for the number of FEC packets remains the same. In such a way, the redundancy determining portion 105 can change the value of increase or decrease Δr for the error-correcting coding rate in accordance with the evaluated value of the degree of uniformity of directions of the motions in a predetermined display range, for example.

That is, the change amount detector 103 evaluates the degree of uniformity of directions of a plurality of blocks (macroblocks) in a predetermined display range in a first frame on a display screen with respect to blocks in a second frame referred to in order to encode the image data of each of the plurality of blocks. The redundancy determining portion 105 determines the number of data of redundant data when the evaluated value of the degree of uniformity in a predetermined display range is a first evaluated value and the amount of change is a first amount of change in the way described below. That is, the redundancy determining portion 105 determines the number of data of redundant data in a predetermined display range as being larger than that occurring when the evaluated value of the degree of uniformity is a second evaluated value being larger than the first evaluated value and the amount of change is the first amount of change.

The reason for the performance of such processing is described below. That is, when the directions of the motions in a predetermined display range are not uniform, even if a motion vector of movie data that is lost is estimated from a motion vector of movie data adjacent to its display position, there is a high possibility that the estimation is incorrect. If error concealment is performed based on the estimation, a displayed image may probably be different largely from an image that should be reproduced originally.

In contrast, when the directions of the motions in a predetermined display range are uniform, when a motion vector of movie data that is lost is estimated from a motion vector of movie data adjacent to its display position, there is a high possibility that the estimation is accurate. If error concealment is performed based on the estimation, a displayed image may probably be close to an image that should be reproduced originally. Thus, the determination of the error-correcting coding rate using both the amount of change employing a motion vector and the degree of uniformity of directions enables the effectiveness of the error concealment function to be evaluated more accurately.

In addition to the method for calculating the amount of change described above, a method for calculating the amount of change by analyzing an image input from the image input device 101 can be used, for example. That is, for example, the change amount detector 103 detects an object, for example, by face recognition and calculates the amount of movement of the detected object between frames as the amount of change for the frame. That is, the change amount detector 103 calculates the amount of change based on the size of an object detected in an image in a predetermined range on the display screen and the amount of movement of the object between frames.

The change amount detector 103 can set the error-correcting coding rate in accordance with the amount of movement of an object by calculating the amount of change from the amount of movement of the detected object. When the amount of movement of the object on the display screen is large, the error-correcting coding rate can be set higher. This can reduce degradation in image quality when the object is moving. The change amount detector 103 can calculate the amount of change by calculating the amount of movement of the detected object without having to refer to motion information indicating a motion vector.

Still another method can be a method for detecting the amount of change using camera motion information about pan, tilt, and zoom of the image input device 101.

The change amount detector 103 calculates the amount of change in accordance with motion information that indicates motion of an image capturing device during image capture and that is contained in image data.

The change amount detector 103 can calculate the amount of change by employing information about motion of the camera with smaller calculation.

In the present embodiment, the change amount detector 103 calculates the amount of change and determines the error-correcting coding rate on a frame-by-frame basis. However, the change amount detector 103 may perform these processing in units of a plurality of frames (e.g., GOP basis), as described above.

In this case, the change amount detector 103 sums the amounts of change between frames in an image of a predetermined display range in images corresponding to image data for a plurality of frames. When the total of the amounts of change for the plurality of frames is a first value, the redundancy determining portion 105 may determine the number of data of redundant data of the plurality of frames such that the number of data of redundant data for image data in the predetermined display range is larger than that occurring when the total is a second value. Each of the first and second values is a threshold that can be set freely by the above-described way. The second value is smaller than the first value.

The calculation of the amount of change and determination of the error-correcting coding rate may be achieved for each region in a frame. This will be described in a second embodiment.

The transmitting apparatus 100 may obtain in advance an error concealment method to be performed by the receiving apparatus 402. That is, the communication controller 108 of the transmitting apparatus 100 can transmit, to the receiving apparatus 402, a signal for inquiring about the type of error concealment to be performed by the receiving apparatus before transmitting movie data. The change amount detector 103 may switch the method for evaluating the effectiveness of the error concealment, depending on the type of the error concealment informed by the receiving apparatus 402.

The second embodiment of the present invention will now be described while differences from the first embodiment are focused. In the above-described first embodiment, the amount of change is detected in units of a frame of a movie image, and the error-correcting coding rate is uniformly determined for each movie-image frame. In contrast, in the second embodiment, one movie frame is divided into a region where the amount of change is large and a region where the amount of change is small, and different error-correcting coding rates are determined for these regions. The functional configuration of the transmitting apparatus 100 is substantially the same as that of the first embodiment.

Figure 5:
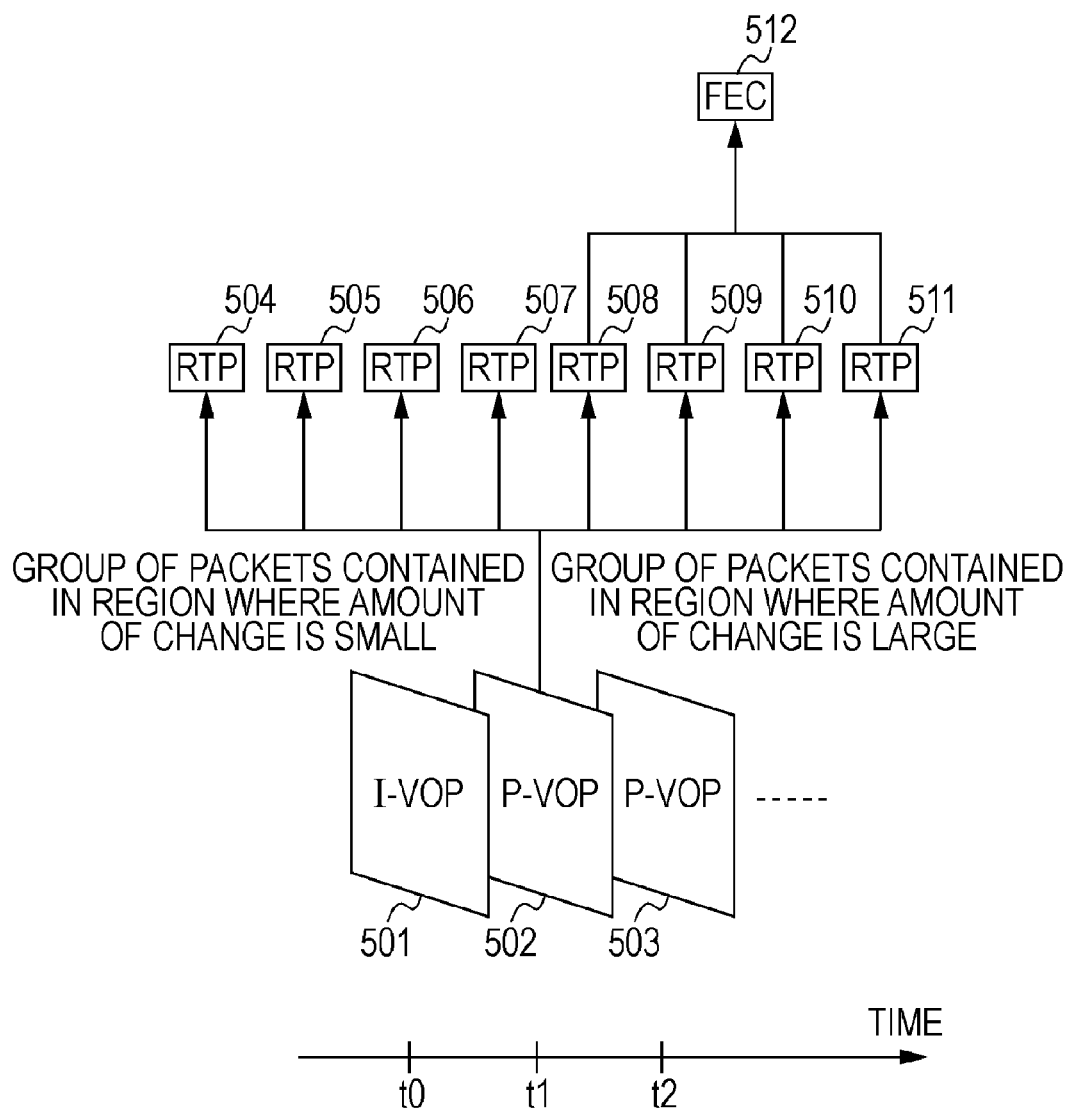
FIG. 5 illustrates a relationship among movie frames, RTP packets, and FEC packets according to another embodiment of the present invention.

FIG. 5 illustrates the relationship among movie frames encoded by the movie encoder 102, RTP packets generated by the packet generator 104, and an FEC packet (redundant data) generated by the error correcting encoder 107 according to the present embodiment with time.

Frames 501 to 503 are frames of a movie image encoded by the movie encoder 102. The frame 501 encoded at time t0 is an intra-coded frame (I-VOP). Each of the frame 502 encoded at time t1 and the frame 503 encoded at time t2 is an inter-frame prediction coded frame (P-VOP). Although frames are present after time t2, these frames are not illustrated in FIG. 5.

The frames 501 to 503 are input into the packet generator 104 on a frame-by-frame basis, and packeted by the packet generator 104, and stored in the buffer 106. The frame 502 encoded at time t1 is formed into eight RTP packets 504 to 511. In FIG. 3, each of the frames 302 and 305 is formed into four RTP packets, whereas in the present embodiment, the frame 502 is formed into eight RTP packets. Although each of the frames 501 and 503 and frames that are not illustrated are also formed into RTP packets, these RTP packets are not illustrated in FIG. 5.

The change amount detector 103 detects the amount of change between the frames 502 and 501 on a macroblock basis. The frame 501 is the reference frame for the frame 502. That is, the receiving apparatus 402 conceals an error when movie data in the frame 502 is lost by packet loss employing the movie data in the frame 501.

In step S201 of the flowchart illustrated in FIG. 2, the change amount detector 103 sums the amounts of change detected on a macroblock basis for each RTP packet. That is, the change amount detector 103 calculates the amount of change between frames in an image in a predetermined display range in images corresponding to image data in step S201 (calculating step).

The redundancy determining portion 105 performs steps S202 to S204 for each RTP packet and divides the RTP packets into a group of packets in which the total of the amounts of change is larger than a predetermined value and a group of packets in which the total of the amounts of change is smaller than the predetermined value. That is, in step S202, the RTP packets are divided into an RTP packet whose amount of change is larger than a first threshold and an RTP packet whose amount of change is smaller than the first threshold. As illustrated in FIG. 5, the RTP packets 504 to 511 corresponding to the frame 502 are divided into a group of packets in which the total of the amounts of change is smaller than the first threshold (RTP packets 504 to 507) and a group of packets in which the total of the amounts of change is larger than the first threshold (RTP packets 508 to 511). The amount of change of each of the RTP packets 504 to 507 is determined in step S204 as being smaller than a second threshold.

For the group of packets in which the total of the amounts of change is small (RTP packets 504 to 507), the redundancy determining portion 105 determines the error-correcting coding rate as, for example, 0% in order that an error is handled by the error concealment function of the receiving apparatus 402. That is, the error correcting encoder 107 generates no FEC packet from the RTP packets 504 to 507. In contrast, for the group of packets in which the total of the amounts of change is large (RTP packets 508 to 511), the redundancy determining portion 105 determines the error-correcting coding rate as 20% in order that an error is handled by the error processing using FEC data (redundant data). That is, the error correcting encoder 107 generates one FEC packet 512 from the four RTP packets 508 to 511.

In step S203 (determination step), when the amount of change is a first value, the redundancy determining portion 105 determines the number of data of redundant data such that the number of data of redundant data for image data in a predetermined display range is larger than that occurring when the amount of change is a second value being smaller than the first value. In step S208 (transmission step), the communication controller 108 transmits the redundant data based on the determined number of data of redundant data together with image data in the predetermined display range.

As described above, the transmitting apparatus 100 according to the present embodiment detects the amount of change on a macroblock basis, divides a movie frame into a region where the amount of change is large and a region where the amount of change is small, and determines different error-correcting coding rates for these regions. This enables the error-correcting coding rate to be controlled in accordance with the effectiveness of the error concealment function and also enables the communication band to be efficiently used while at the same time the image quality of a movie image is maintained even if a communication error occurs. With the transmitting apparatus 100 according to the present embodiment, the error-correcting coding rate is determined for each region in a frame. Thus, advantages similar to the above are obtainable.

In the present embodiment, the change amount detector 103 detects the amount of change on a macroblock basis. However, any unit may be used as long as the unit allows the error-correcting coding rate to be determined for each of regions of a frame. For example, the amount of change can be detected in units of a pixel, a plurality of macroblocks, a slice, and a video packet (RTP packet). Various methods can be used as the error concealment method and the method for detecting the amount of change, similar to the first embodiment.

In the present embodiment, the determination of the error-correcting coding rate in accordance with the amount of change of the frame 502, which is a P-VOP, is described. The frame 501, which is an I-VOP, and other frames are subjected to similar determination of the error-correcting coding rate.

In the above-described embodiments, MPEG-4 is used as the coding method for movie data, and RTP is used as the protocol for transferring encoded movie data. However, the coding method for movie data is not limited to MPEG-4. For example, similar coding methods using prediction coding, such as MPEG-2 and H.264, can be used. The configuration that determines the error-correcting coding rate in accordance with the difference in image between frames or the difference in image between adjacent display ranges in the same frame is also applicable to transmission of uncompressed movie data and movie data conforming to a coding method that does not use inter-frame prediction coding. In addition, the configuration that determines the error-correcting coding rate in accordance with the difference in image between adjacent display ranges in the same frame is also applicable to transmission of a still image. That is, the present invention is also applicable to various kinds of image data, including a still image, in addition to image data conforming to MPEG-4. Other transfer protocols, such as the transmission control protocol (TCP), can also be used as the data transfer protocol, in addition to RTP.

In the above-described embodiments, the transmitting apparatus 100 has the function of encoding movie data. However, the movie encoder 102 may be configured as a device different from the transmitting apparatus 100.

The above-described embodiments can be achieved by software using a computer of a system or an apparatus (or central processing unit (CPU) or microprocessor unit (MPU)). Accordingly, a computer program in itself supplied to a computer and installed therein to achieve the functional processing of the present invention using the computer can also accomplish the present invention. That is, a computer program in itself for achieving the functional processing of the present invention is also included in the present invention. In this case, the program can have any form, such as object code, a program executed by an interpreter, and script data supplied to an operating system, as long as it has the function of the program.

As the storage medium for supplying such program code, a floppy disk, a hard disk, an optical disk, a magneto-optical disk, a compact-disk read-only memory (CD-ROM), a CD-recordable (CD-R), a magnetic tape, a nonvolatile memory card, a nonvolatile semiconductor memory, a ROM, and a digital versatile disc (DVD), for example, can be used.

A computer program for achieving the functional processing of the present invention using a computer can be supplied to the computer through a storage medium, wired communication, or wireless communication.

As a method for supplying a program using wired/wireless communication, a method using a server on a computer network can be used, for example. In this case, a data file (program data file) that can be a computer program forming the present invention is stored in the server. The program data file may be executable code, or may also be source code.

The program is supplied by downloading of the program data file into a client computer that accesses the server. In this case, the program data file can be divided into a plurality of segment files, the segment files can be stored in different servers. That is, a sever device that supplies the program data file for achieving the functional processing of the present invention is also included in the present invention.

Storage media that store an encrypted computer program of the present invention can be distributed to users, key information for solving encryption can be supplied to a user who satisfies a predetermined condition, and the program can be installed in a computer owned by the user. The key information can be supplied by being downloaded from a web page through the Internet.

A computer program for achieving the functions of at least one of the embodiments using a computer can employ the function of an operating system running on the computer. In addition, at least part of a computer program forming the present invention supplied as firmware of an expansion board attached in a computer, and the functions of at least one of the above embodiments can also be achieved using a CPU of the expansion board.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-190945 filed Jul. 24, 2008, which is hereby incorporated by reference herein in its entirety.

What is claimed is:

1. A transmitting apparatus for transmitting redundant data usable in correction of an error of image data by a receiving apparatus together with the image data to the receiving apparatus, the transmitting apparatus comprising:

a calculating unit configured to calculate an amount of change between frames of an image in a predetermined display range in images corresponding to the image data;

a determining unit configured to, when the amount of change is a first value, determine a number of data of the redundant data such that the number of data of the redundant data for image data of the image in the predetermined display range is larger than a number of the redundant data occurring when the amount of change is a second value being smaller than the first value; and a transmitting unit configured to transmit the redundant data based on the determined number of data of the redundant data together with the image data of the image in the predetermined display range.

2. A transmitting apparatus for transmitting redundant data usable in correction of an error of image data by a receiving apparatus together with the image data to the receiving apparatus, the transmitting apparatus comprising:

a calculating unit configured to calculate a difference between an image in a predetermined display range and an image in a display range adjacent to the predetermined display range in images corresponding to the image data;

a determining unit configured to, when the difference is a first value, determine a number of data of the redundant data such that the number of data of the redundant data for image data of the image in the predetermined display range is larger than a number of the redundant data occurring when the difference is a second value being smaller than the first value; and a transmitting unit configured to transmit the redundant data based on the determined number of data of the redundant data together with the image data of the image in the predetermined display range.

3. The transmitting apparatus according to claim 1, wherein the calculating unit is configured to sum the amounts of change between frames of the image in the predetermined display range for a plurality of frames, and the determining unit is configured to, when the total of the amounts of change for the plurality of frames is a first amount of change, determine the number of data of the redundant data in the predetermined display range for the plurality of frames such that the number of data of the redundant data for the image data of the image in the predetermined display range is larger than a number of the redundant data occurring when the total of the amounts of change is a second amount of change being smaller than the first amount of change.

4. The transmitting apparatus according to claim 2, wherein the calculating unit is configured to sum the differences between the image in the predetermined display range and the image in the display range adjacent to the predetermined display range for a plurality of frames, and the determining unit is configured to, when the total of the differences for the plurality of frames is a first value, determine the number of data of the redundant data in the predetermined display range for the plurality of frames such that the number of data of the redundant data for the image data of the image in the predetermined display range is larger than a number of the redundant data occurring when the total of the differences is a second value being smaller than the first value.

5. The transmitting apparatus according to claim 1, wherein the amount of change is calculated in accordance with a difference value between frames of the image in the predetermined display range.

6. The transmitting apparatus according to claim 1, wherein the amount of change is calculated in accordance with information that indicates a distance between an image in a predetermined display range in a first frame and an image in a corresponding display range in a second frame referred to in order to encode the image in the predetermined display range in the first frame.

7. The transmitting apparatus according to claim 1, wherein the amount of change is calculated in accordance with a size of an object detected from the image in the predetermined display range and an amount of movement of the object between frames.

8. The transmitting apparatus according to claim 1, wherein the calculating unit is configured to calculate the amount of change in accordance with motion information that indicates a motion of an image capturing device during image capture and that is contained in the image data.

9. The transmitting apparatus according to claim 1, wherein the determining unit is configured to, when the amount of change is the first value, increase the number of data of the redundant data for the image data by a predetermined number of data.

10. The transmitting apparatus according to claim 1, wherein the calculating unit is configured to evaluate a degree of uniformity of directions on a display screen of a plurality of blocks in the predetermined display range in a first frame with respect to blocks in a second frame referred to in order to encode image data of the plurality of blocks in the first frame to obtain an evaluated value, and the determining unit is configured to determine a number of data of the redundant data occurring when the evaluated value of the degree of uniformity of the directions detected in the predetermined display range is a first evaluated value and the amount of change is the first value as being larger than a number of data of the redundant data occurring when the evaluated value of the degree of uniformity of the directions detected in the predetermined display range is a second evaluated value being larger than the first evaluated value and the amount of change is the first value.

11. A transmitting method for use in a transmitting apparatus for transmitting redundant data usable in correction of an error of image data by a receiving apparatus together with the image data to the receiving apparatus, the transmitting method comprising:

calculating an amount of change between frames of an image in a predetermined display range in images corresponding to the image data;

determining, when the amount of change is a first value, a number of data of the redundant data such that the number of data of the redundant data for image data of the image in the predetermined display range is larger than a number of the redundant data occurring when the amount of change is a second value being smaller than the first value; and transmitting the redundant data based on the determined number of data of the redundant data together with the image data of the image in the predetermined display range.

12. A storage medium that stores a program readable by a computer that transmits redundant data usable in correction of an error of image data by a receiving apparatus together with the image data to the receiving apparatus, the program comprising:

calculating an amount of change between frames of an image in a predetermined display range in images corresponding to the image data;

determining, when the amount of change is a first value, a number of data of the redundant data such that the number of data of the redundant data for image data of the image in the predetermined display range is larger than a number of the redundant data occurring when the amount of change is a second value being smaller than the first value; and transmitting the redundant data based on the determined number of data of the redundant data together with the image data of the image in the predetermined display range.

13. A transmitting method for use in a transmitting apparatus for transmitting redundant data usable in correction of an error of image data by a receiving apparatus together with the image data to the receiving apparatus, the transmitting method comprising:

calculating a difference between an image in a predetermined display range and an image in a display range adjacent to the predetermined display range in images corresponding to the image data;

determining, when the difference is a first value, a number of data of the redundant data such that the number of data of the redundant data for image data of the image in the predetermined display range is larger than a number of the redundant data occurring when the difference is a second value being smaller than the first value; and transmitting the redundant data based on the determined number of data of the redundant data together with the image data of the image in the predetermined display range.

14. A storage medium that stores a program readable by a computer that transmits redundant data usable in correction of an error of image data by a receiving apparatus together with the image data to the receiving apparatus, the program comprising:

calculating a difference between an image in a predetermined display range and an image in a display range adjacent to the predetermined display range in images corresponding to the image data;

determining, when the difference is a first value, a number of data of the redundant data such that the number of data of the redundant data for image data of an image in the predetermined display range is larger than a number of the redundant data occurring when the difference is a second value being smaller than the first value; and transmitting the redundant data based on the determined number of data of the redundant data together with the image data of the image in the predetermined display range.

15. The transmitting method according to claim 11, wherein, in the calculating the amount of change, the amounts of change between frames of the image in the predetermined display range for a plurality of frames are summed, and in the determining the number of data of the redundant data, when the total of the amounts of change for the plurality of frames is a first amount of change, the number of data of the redundant data in the predetermined display range for the plurality of frames is determined such that the number of data of the redundant data for the image data in the predetermined display range is larger than a number of the redundant data occurring when the total of the amounts of change is a second amount of change being smaller than the first amount of change.

16. The transmitting method according to claim 13, wherein, in the calculating the difference, the differences between the image in the predetermined display range and the image in the display range adjacent to the predetermined display range for a plurality of frames are summed, and in the determining the number of data of the redundant data, when the total of the differences for the plurality of frames is a first value, the number of data of the redundant data in the predetermined display range for the plurality of frames is determined such that the number of data of the redundant data for the image data of the image in the predetermined display range is larger than a number of the redundant data occurring when the total of the differences is a second value being smaller than the first value.

17. The transmitting method according to claim 11, wherein the amount of change is calculated in accordance with a difference value between frames of the image in the predetermined display range.

18. The transmitting method according to claim 11, wherein the amount of change is calculated in accordance with information that indicates a distance between an image in a predetermined display range in a first frame and an image in a corresponding display range in a second frame referred to in order to encode the image in the predetermined display range in the first frame.

19. The transmitting method according to claim 11, wherein the amount of change is calculated in accordance with a size of an object detected from the image in the predetermined display range and an amount of movement of the object between frames.

20. The transmitting method according to claim 11, wherein, in the calculating the amount of change, the amount of change is calculated in accordance with motion information that indicates a motion of an image capturing device during an image capture and that is contained in the image data.

21. The transmitting method according to claim 11, wherein, in the calculating the amount of change, a degree of uniformity of directions on a display screen of a plurality of blocks in the predetermined display range in a first frame with respect to blocks in a second frame referred to in order to encode image data of the plurality of blocks in the first frame is evaluated to obtain an evaluated value, and in the determining the number of data of the redundant data, a number of data of the redundant data occurring when the evaluated value of the degree of uniformity of the directions detected in the predetermined display range is a first evaluated value and the amount of change is the first value is determined as being larger than a number of data of the redundant data occurring when the evaluated value of the degree of uniformity of the directions detected in the predetermined display range is a second evaluated value being larger than the first evaluated value and the amount of change is the first value.

* * * * *